United States Patent
Yew et al.

Patent Number: 5,869,368
Date of Patent: Feb. 9, 1999

[54] METHOD TO INCREASE CAPACITANCE

[76] Inventors: Tri-Rung Yew; Water Lur; Shih-Wei Sun, all of c/o United Microelectronics Corporation, No. 13 Innovation First Road, Science Industrial Park, Hsin-Chu City, Taiwan

[21] Appl. No.: 934,785

[22] Filed: Sep. 22, 1997

[51] Int. Cl.$^6$ .............................................. H01L 21/8242
[52] U.S. Cl. ........................................... 438/255; 438/398
[58] Field of Search ................................ 438/238, 239, 438/253–256, 381, 396–399; 257/306, 307, 309

[56] References Cited

U.S. PATENT DOCUMENTS

| | | | |
|---|---|---|---|
| 5,405,799 | 4/1995 | Woo | 438/398 |
| 5,650,351 | 7/1997 | Wu | 438/398 |
| 5,702,968 | 12/1997 | Chen | 438/255 |

*Primary Examiner*—Joni Chang

[57] ABSTRACT

A high capacitance charge storage capacitor for a DRAM has a lower electrode in contact with one source/drain region of a transfer FET. The lower capacitor electrode includes a first layer of polysilicon deposited over part of the transfer FET and in contact with the source/drain region of the transfer FET. An oxide layer is deposited over the first polysilicon layer and then a sparse layer of hemispherical grained polysilicon is deposited on the surface of the oxide layer. The sparse layer of hemispherical grained polysilicon has grains on the order of approximately 100 nanometers across that are separated on the average by approximately 100 nanometers. The layer of oxide is etched using the sparse grains of hemispherical grained polysilicon as a mask, with the etch process stopping on the surface of the first layer of polysilicon. A second layer of polysilicon is deposited over the remaining grains of hemispherical grained polysilicon and over the column-shaped portions of the oxide layer left by the etching stop. A capacitor dielectric is formed over the second layer of polysilicon and then an upper capacitor electrode is provided.

20 Claims, 3 Drawing Sheets

METHOD TO INCREASE CAPACITANCE

BACKGROUND OF THE INVENTION

1. Field of the Invention

The present invention relates to the formation of capacitors for integrated circuit memories and particularly to methods of forming high capacitance structures in a high production volume manufacturing environment.

2. Description of the Related Art

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is typically accomplished using a transfer field effect transistor (FET). The bit line contact is typically made to one of the source/drain electrodes of the transfer FET and the charge storage capacitor is typically formed in contact with the other of the source/drain electrodes of the transfer FET. Word line signals are supplied to the gate of the FET to connect one electrode of the charge storage capacitor through the transfer FET to the bit line contact facilitating the transfer of charge between the charge storage capacitor and the bit line.

There is a continuing trend toward increasing the storage density of integrated circuit memories to provide increased quantities of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates and in part by decreasing the separation between the structures that make up the integrated circuit device. Reducing the size of circuit structures is generally referred to as decreasing the "design rules" used for the manufacture of the integrated circuit device.

Applying reduced design rules to a DRAM reduces the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which are undesirable since the memory may be unavailable for data storage and readout transactions during refresh activities. In addition, reduced levels of charge storage might require more sophisticated data readout schemes or more sensitive charge sensing amplifiers. Thus, modem DRAMs require increased levels of capacitance in reduced substrate area DRAM cells. To this end, a variety of very complex capacitor structures having three dimensional charge storage surfaces have been proposed. In general, these complex capacitor structures are difficult to manufacture. This is particularly true when the requirements are taken into account for forming such capacitor structures in a high throughput manufacturing environment in a manner compatible with high yields.

One strategy that has been adopted in attempting to improve the DRAM cell capacitance has been to incorporate hemispherical grained polysilicon within the charge storage capacitor. Most current DRAM capacitor designs incorporate conventional polysilicon within both electrodes of the capacitor. While the conventional polysilicon can be shaped into very complex shapes, its surface is essentially smooth. Hemispherical grained polysilicon (HSG-Si) is a particular form of polysilicon that has a rough surface when deposited under carefully controlled conditions and which can be incorporated on the surface of the capacitor electrode to increase the surface area of the electrode. By providing a layer of hemispherical grained polysilicon on one capacitor electrode, the capacitance of a given DRAM charge storage capacitor can be increased by a factor of approximately 1.8 times.

There are, on the other hand, disadvantages to the use of HSG-Si in DRAM capacitors. HSG-Si can have unpredictable surface properties that can reduce capacitance or reduce the stability of the capacitor. In addition, it can be difficult to adequately dope HSG-Si during deposition. Thus, in addition to the precise control required in the deposition process, it is typically necessary to include a separate doping step to ensure that the HSG-Si layer has an appropriate level of conductivity for use on the surface of the capacitor electrode. The processing difficulty associated with using HSG-Si on the surface of a polysilicon capacitor electrode limits is applicability to high volume manufacturing processes. In many instances, the gain in capacitance achieved through use of HSG-Si in a capacitor does not justify the added expense and reduced yields associated with its use.

It is an object of the present invention to provide increased levels of charge storage capacitance for an integrated circuit capacitor of the type that might be used in a memory. It is a further object of the present invention to provide increased capacitance in a highly manufacturable manner.

SUMMARY OF THE PREFERRED EMBODIMENTS

According to one aspect, the present invention provides increased capacitance to a charge storage structure in an integrated circuit that has an access circuit for controlling access to the charge storage structure through an electrode contact. A first conductive layer is provided over the substrate and a layer of dielectric material is provided over the first conductive layer. A layer consisting of grains of polysilicon is provided over the surface of the layer of dielectric material so as to leave uncovered portions of the surface of the layer of dielectric layer between the grains of polysilicon. Exposed portions of the layer of dielectric material are selectively removed to form spaced apart columns of dielectric material extending above the first conductive layer. A second conductive layer is provided over the columns of dielectric material. A capacitor dielectric layer is provided over the second conductive layer. A third conductive layer is then provided over the capacitor dielectric layer.

Another aspect of the present invention provides increased capacitance to a charge storage capacitor connected to a field effect transistor having a source/drain region formed on a substrate. A first dielectric layer is provided over the field effect transistor and a contact via is formed to expose the source/drain region. A first polysilicon layer is provided over the first dielectric layer which is electrically connected to the source/drain region. A second dielectric layer is provided over the first polysilicon layer and a layer of hemispherical grained polysilicon is provided over the second dielectric layer. Portions of the second dielectric layer are exposed between grains of the layer of hemispherical grained polysilicon. Anisotropic etching removes the second dielectric layer to expose a portion of the first polysilicon layer in a pattern defined by the grains of the layer of hemispherical grained polysillicon. Structures etched from the second dielectric layer extend above the first polysilicon layer. A second polysilicon layer is deposited over the exposed pattern of the first polysilicon layer and over the structures etched from the second dielectric layer. A third dielectric layer is provided over the second polysilicon layer and a third polysilicon layer is provided over the third dielectric layer.

DETAILED DESCRIPTION OF THE PREFERRED EMBODIMENTS

Preferred embodiments of the present invention provide a high capacitance DRAM capacitor using methods compatible with high volume manufacture. In accordance with a particularly preferred embodiment of the present invention, a transfer FET is formed for the DRAM cell in and on a substrate along with the wiring lines and other portions of the access circuitry for the DRAM cell. The lower electrode of the charge storage capacitor is formed in a several stage process. A first layer of polysilicon is deposited in contact with one of the source/drain regions of the transfer FET and then a layer of silicon oxide is deposited on the first layer of polysilicon. Hemispherical grained polysilicon (HSG-Si) is formed on the surface of the silicon oxide layer so that the grains are relatively sparsely distributed over the surface. The grains of HSG-Si are used as a mask to selectively etch the oxide layer, preferably stopping on the first layer of polysilicon, with the first layer functioning as an etch stop for the etching process. A second layer of polysilicon is deposited over the grains of HSG-Si, over the remaining, column-shaped portions of the oxide layer and in contact with the first layer of polysilicon to provide a surface for the lower capacitor electrode. The second layer of polysilicon is rendered conductive, preferably by in situ doping during deposition. A capacitor dielectric layer and an upper capacitor electrode are provided to complete the DRAM capacitor.

Manufacture of a DRAM in this manner provides a device that has a high level of capacitance using a comparatively simple process. Features are provided on the DRAM capacitor that are smaller than the photolithography resolution limit because the vertically extending portions of the bottom electrode are formed in an etching process that uses a mask made up of grains of hemispherical grained polysilicon. The layer of hemispherical grained polysilicon has grain sizes on the order of approximately 50–100 nanometers and individual grains are preferably spaced apart by a distance on the order of 50–100 nanometers. The bottom capacitor electrode formed about the insulating structures defined using the mask has structures with lateral dimensions much smaller than the lithography resolution limit presently available in commercial steppers. In addition, while this method is easily implemented for capacitors based on polysilicon electrodes, the method may also be implemented using a variety of other conductors within the capacitor. Further discussion of these aspects and other preferred aspects of the present invention is now presented with specific reference to FIGS. 1–7.

Figure 1:
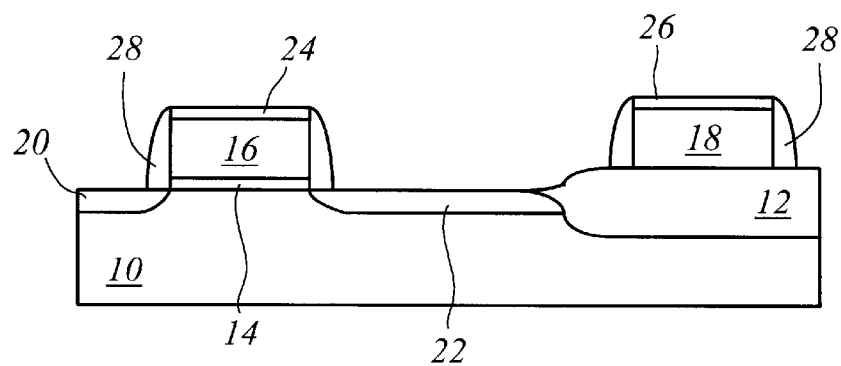
FIGS. 1–7 illustrate steps in the manufacture of a DRAM in accordance with preferred aspects of the present invention.
Figure 2:
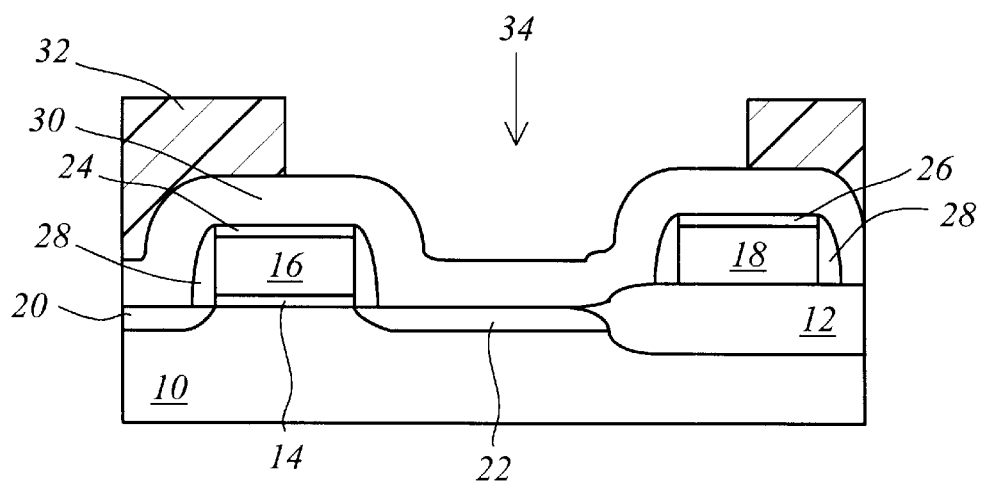

Formation of a dynamic random access memory (DRAM) in accordance with preferred embodiments of the present invention begins on a P-type silicon substrate 10. FIG. 1 illustrates a substrate 10 having device isolation structures 12 formed on its surface and with a gate oxide layer 14 covering the active device regions of the substrate. The device illustrated in FIG. 1 incorporates field oxide regions formed by the local oxidation of silicon (LOCOS) technique as device isolation structures 12. Other types of device isolation regions might alternately be provided including, for example, shallow trench isolation regions filled with CVD oxide.

Transfer FETs are formed on the active device region in the conventional fashion. Typically, a polysilicon layer is deposited over the substrate and patterned to define polysilicon gate electrodes 16 and wiring lines 18. The polysilicon may be doped either in situ during deposition or by ion implantation of the blanket deposited polysilicon layer before patterning or at some later point in processing. N-type source/drain regions are 20, 22 provided in the substrate 10 on either side of gate electrode 16. In some embodiments, it may be preferred to provide a lightly doped drain (LDD) structure for each of the source/drain regions 20, 22 illustrated in FIG. 1.

Presently, however, it is more desirable to provide a uniformly doped N-type region for each of the source/drain regions 20, 22.

It is typically preferred to provide protective dielectric layers around the gate electrode 16 and the wiring line 18 to protect these conductors during subsequent processing and to reduce the possibility of undesired contacts being formed to the conductors 16, 18. Consequently, it is typical to provide oxide layers 24, 26 over the gate electrode 16 and wiring line 18, respectively. Typically, these oxide layers are provided over the blanket deposited polysilicon layer prior to the patterning steps used to define the gate electrode 16 and wiring line 18. Alternately, silicon nitride or an oxynitride might be provided as a capping, protective dielectric layer over the gate electrode. It is also desirable to form protective dielectric layers on the sides of gate electrode 16 and wiring line 18. In some cases oxide spacer structures 28 are formed on the sides of gate electrode 16 and wiring line 18 in the process of forming a lightly doped drain (LDD) structure for the source/drain regions of the transfer FET. In those embodiments where an LDD structure is formed for the source/drain regions, the oxide spacer structures are typically left in place during subsequent processing. In those presently preferred embodiments of the present invention in which a constant doping is at least initially provided to the source/drain regions 20, 22, oxide spacer structures 28 are preferably formed alongside the gate electrode 16 and wiring line 18 to protect those conductors and to prevent shorts later in processing. Oxide spacer structures 28 may be formed by providing a blanket oxide layer by chemical vapor deposition (CVD) to a thickness approximately equal to the width desired for the oxide spacer structures 28. An anisotropic etchback process using, for example, an etchant derived from a plasma source incorporating a $CF_4$ or other fluorine bearing species may be used to form the illustrated oxide spacer structures 28.

Figure 3:
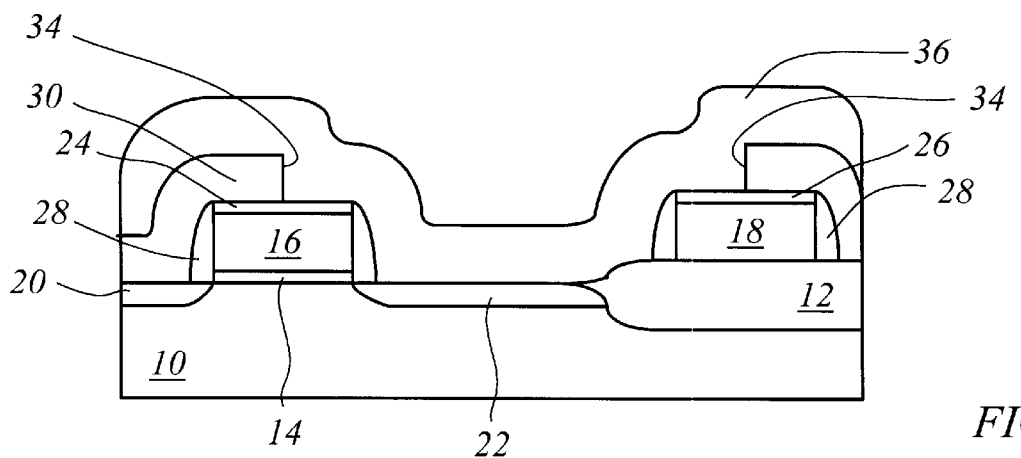

After the transfer FET and wiring lines are defined, a layer of oxide 30 is deposited over the FIG. 1 structure. Typically, the oxide layer is deposited to a thickness of 1000–2000 Å by a chemical vapor deposition (CVD) process. The oxide layer 30 shown in FIG. 2 protects the circuitry formed on the FET, including the source/drain regions 20, 22, so that inadvertent and unintended contacts are avoided throughout subsequent processing steps. The capacitor formation process begins by defining a contact via which exposes the source/drain region 22 of the transfer FET so that the bottom capacitor electrode can be formed in contact with the source/drain region 22. To this end, a photoresist mask 32 is defined by conventional photolithography on oxide layer 30 so as to have an opening 34 over the selected source/drain region 22. Etching is performed through the opening 34 to form a via through the oxide layer 30, for example, using plasma etching with a fluorine etch chemistry. Preferably, this etching step stops on the substrate but still clears the source/drain region 22 so the bottom capacitor electrode can be formed partially on the source/drain region 22. The photoresist mask 32 is stripped, preferably by ashing, leaving behind the unetched portions of the oxide layer 30. The sidewalls 34 of the oxide layer 30 that face on the contact via provide elevation and further structure for the bottom capacitor electrode to be formed in contact with the source/drain region 22. Next, a layer of polysilicon 36 is deposited by low pressure chemical vapor deposition (LPCVD) to a thickness of approximately 1500–2500 Å as shown in FIG. 3. This polysilicon layer 36 may be doped N-type in situ during deposition or by a subsequent ion implantation and annealing step, as in known in the art. It is possible to use other conductors as the plate on which the lower capacitor electrode is formed, so long as the material can be used as an etch stop for subsequent etching steps.

Next, a layer of oxide 38 (FIG. 4) is deposited by blanket CVD over the polysilicon layer 36 to a thickness of about 2000–3000 Å. The oxide layer 38 will be formed into structures extending above the plate on which the lower capacitor electrode is formed. Although oxide is the most preferred material, these structures need not be oxide or an insulating material if processes are available to make alternate materials compatible with this method. The material used for layer 38 is chosen to be sufficiently different from the layer 36 and hemispherical grained polysilicon to allow the hemispherical grained polysilicon to act as a mask for etching the layer 38, using the layer 36 as an etch stop. Silicon oxide and other insulating materials are particularly preferred for layer 38 because etchants are readily available that selectively etch oxide and other insulators when using polysilicon as a mask and as an etch stop.

Figure 6:
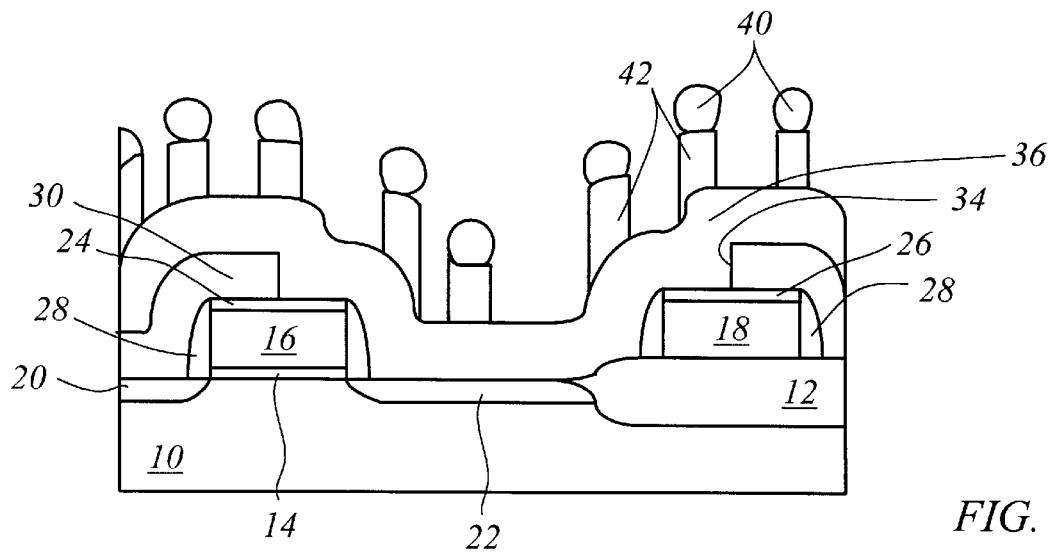

A layer of hemispherical grained polysilicon (HSG-Si) 40 is formed over the oxide layer 38 that will be used as a mask for etching the oxide layer 38 to provide structures extending vertically from the surface of polysilicon layer 36. The HSG-Si layer 40 may be formed in any of the well known methods and may consist of low pressure chemical vapor deposition of HSG-Si from a silane source gas onto a substrate held at a temperature of between 555° C. to 595° C. The resulting structure includes an irregular surface of HSG-Si grains due to the largely random nature of the nucleation of HSG-Si growth. Most preferably, the HSG-Si layer will have a sparse distribution of grains over the surface of the oxide layer 38. For example, the HSG-Si layer 40 may include grains that vary in size from 50–100 nanometers in diameter that are spaced on the average approximately 50–150 nanometers apart. It is typically unnecessary to dope the HSG-Si layer 40 for the grains to be used in an etching mask. The HSG-Si layer 40 is then used as a mask for etching the oxide layer 38. The etching process may, for example, consist of plasma etching using an etchant derived from either a $CHF_3$ or $SF_6$ source gas. The etched structure is shown in FIG. 6 and includes vertically extending portions 42 defined from the oxide layer 38 in the etching process.

In the preferred embodiments of the present invention which utilize oxide or another insulator to form the structures 42 which extend vertically from the surface of the preferred polysilicon layer 36 to the grains 40 of the HSG-Si mask, it is necessary to provide a conductive surface over the structures 42 and, for most embodiments, over the undoped grains of HSG-Si. This is most easily accomplished by LPCVD of a thin layer of polysilicon, preferably doped N-type in situ during deposition or by a subsequent diffusion step. This thin polysilicon layer is designated as 44 in FIG. 7 and is deposited in a substantially conformal manner. The thin polysilicon layer 44 is preferably thick enough to reliably cover the topography presented by polysilicon layer 36, vertical structures 42 and HSG-Si mask grains 40, and to provide a good quality conductor at the surface of the lower capacitor electrode. On the other hand, the polysilicon layer is kept thin so that the layer 44 does not smooth the topography of the lower electrode too much and so that the layer 44 does not fill the spaces between vertical structures 42. To this end, it is preferred that the layer 44 is deposited to a thickness of about 100–400 Å.

Figure 7:
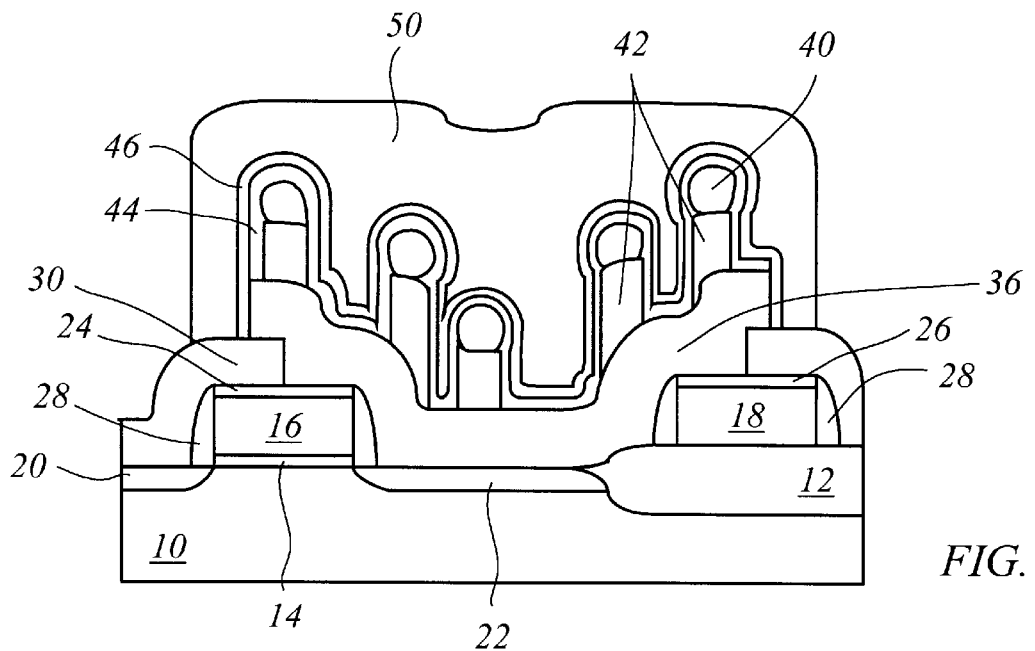

After the thin polysilicon layer 44 is deposited over the surface of the lower capacitor electrode, the lateral extent of the lower electrode is defined by providing a photoresist mask over the polysilicon layer 44 and etching the thin polysilicon layer 44 and etching the lower plate 36 using, for example, a plasma etch using an etchant derived from HCl and HBr source gases. A capacitor dielectric layer 46 is then provided over the surface of the thin polysilicon layer 44 and the edges of the lower plate 36, as shown in FIG. 7. Various capacitor dielectrics are known and include, for example, the multilayer oxide/nitride/oxide dielectric typically referred to as "ONO." Such a structure may be formed by allowing a native oxide layer to grow over the rugged polysilicon surface, depositing a thin layer of silicon nitride by chemical vapor deposition and then oxidizing a thin portion of the nitride surface in a thermal oxidation process to complete the ONO capacitor dielectric 46. More preferably, the lowest oxide layer of the ONO structure is suppressed to form an "NO" capacitor dielectric. Still more preferable is the use of a higher dielectric constant material such as $Ta_2O_5$ or one of the perovskite dielectrics such as barium strontium titanate. Next, an upper capacitor electrode 50 is formed over the bottom capacitor electrode by blanket LPCVD of polysilicon, preferably doped in situ during deposition or by ion implantation and annealing. The upper capacitor electrode 50 is patterned and further processing is performed to complete the DRAM device.

Figure 8:
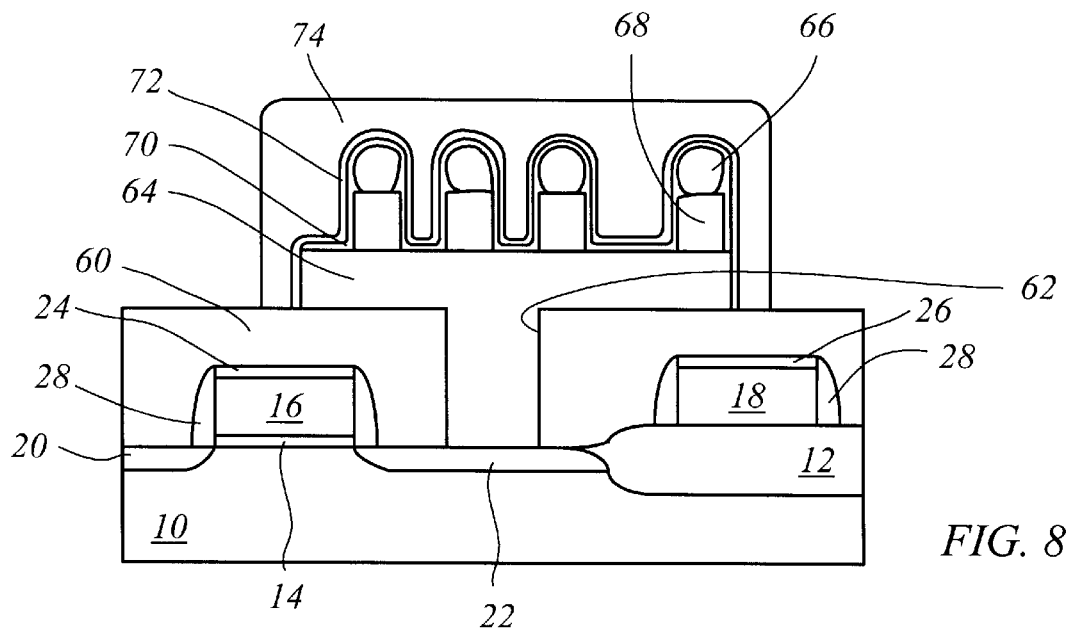
FIG. 8 illustrates another configuration of DRAM formed in accordance with the present invention.

FIG. 8 shows an alternate embodiment of a DRAM cell in accordance with preferred embodiments of the present invention. The structure in FIG. 8 differs from the FIG. 7 structure primarily in the use of a planarized interlayer dielectric 60 in the FIG. 8 DRAM cell. The structural elements of the FIG. 8 DRAM cell are generally similar to those of the FIG. 7 DRAM cell and so the following discussion provides only a summary of the process used for forming the FIG. 8 structure. After formation of the transfer FET and wiring lines of FIG. 1, manufacture of the FIG. 8 DRAM cell proceeds by depositing a comparatively thick interlayer dielectric 60, which may include oxide or other insulators, over the surface of the FIG. 1 device. The surface of the interlayer dielectric 60 is then planarized, for example, using a chemical mechanical polishing (CMP) process. A via 62 is then defined through the planarized interlayer dielectric 60 to expose the source/drain region 22 which the lower capacitor lower electrode will contact.

Figure 4:
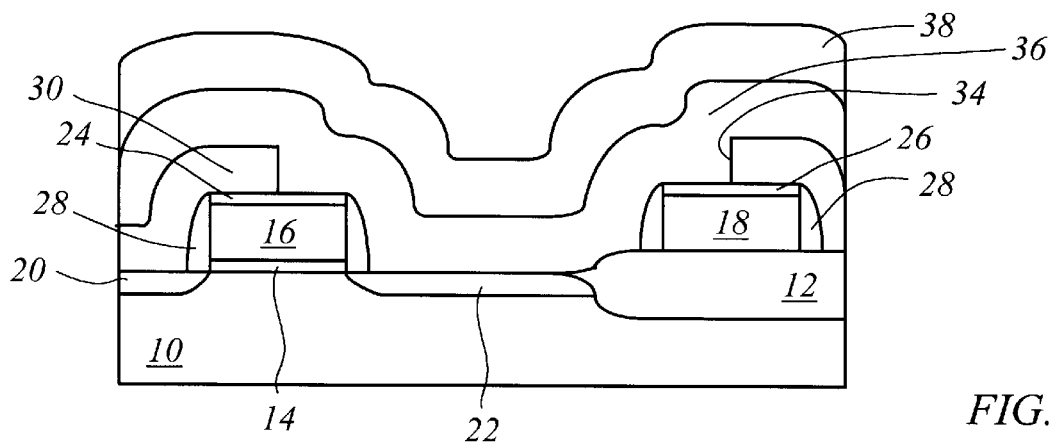
Figure 5:
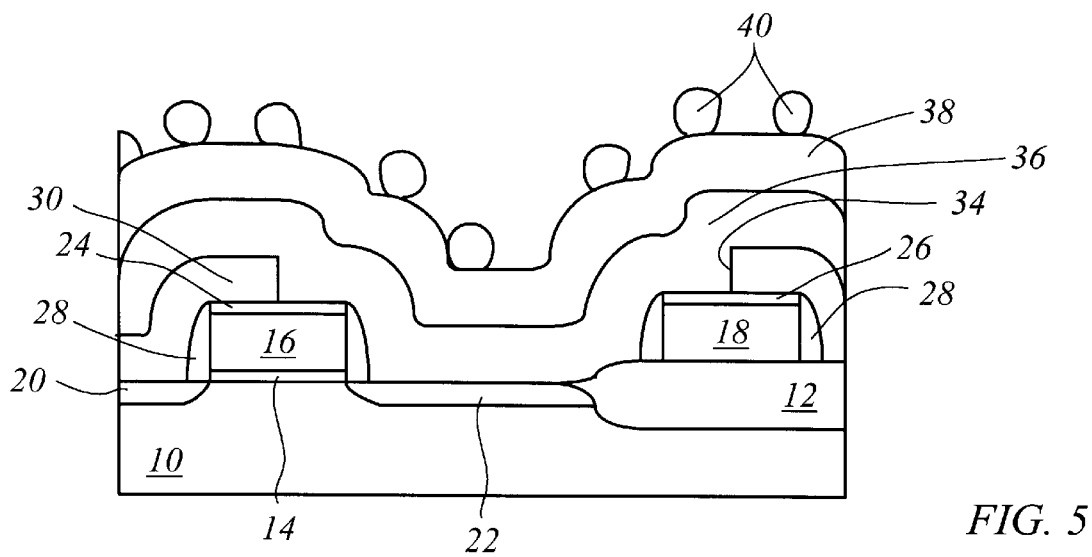

A lower conductive plate is formed for the capacitor electrode, typically by LPCVD of approximately 1500–2500 Å of polysilicon and by using either in situ doping during deposition or ion implantation followed by a subsequent annealing step. If desired, the surface of the plate 64 may be planarized using CMP. Next, a thick oxide layer, similar to layer 38 of FIG. 4, is deposited over the surface of the polysilicon plate 64. Hemispherical grained polysilicon 66 is then deposited over the surface of the thick oxide layer, in a manner similar to that illustrated in FIG. 5. Anisotropic etching of the thick oxide layer is performed using the HSG-Si grains 66 as a mask and an etchant derived in a plasma process from a fluorine-bearing source gas to form vertical structures 68 extending from the surface of the polysilicon plate 64 to the grains 66 of the HSG-Si mask. Processing proceeds by forming a thin, conductive polysilicon layer 70 over the topography of the lower electrode. The lateral extent of the lower capacitor electrode is then defined using photolithography. A capacitor dielectric 72 is provided over the lower electrode and an upper capacitor electrode 74 is formed in the manner discussed above. The FIG. 8 structure and the process of making the FIG. 8 structure have the advantage of greater process latitude than is enjoyed by the FIG. 7 structure, because there is less topography to accommodate in the masking and etching steps of the FIG. 8 manufacturing process.

While the present invention has been described in terms of certain preferred embodiments thereof, those of ordinary skill in the art will appreciate that various modifications might be made to the embodiments described herein without altering the fundamental teachings of the present invention. As such, the present invention is not to be limited to the particular specific embodiments described. Rather, the scope of the present invention is to be determined from the claims which follow.

What is claimed:

1. A method of providing increased capacitance to a charge storage structure in an integrated circuit device, the method comprising:
   providing an access circuit in and on a substrate, the access circuit controlling access to an electrode of the charge storage structure through an electrode contact;
   providing a first conductive layer over the substrate and connected to the electrode contact;
   providing a layer of dielectric material over the first conductive layer;
   providing a layer of grains of polysilicon over a surface of the layer of dielectric material so as to leave uncovered portions of the surface of the layer of dielectric material between the grains of polysilicon;
   selectively removing exposed portions of the layer of dielectric material to form spaced apart columns of dielectric material extending above the first conductive layer;
   providing a conformal second conductive layer over the columns of dielectric material;
   providing a capacitor dielectric layer over the second conductive layer; and
   providing a third conductive layer over the capacitor dielectric layer.

2. The method of claim 1, wherein the access circuit comprises a field effect transistor and the charge storage structure is in a DRAM capacitor over bit line cell.

3. The method of claim 2, wherein the first conductive layer is polysilicon deposited onto a planarized surface of a layer of oxide.

4. The method of claim 1, wherein the first conductive layer comprises polysilicon and wherein the selectively removing stops on the first conductive layer.

5. The method of claim 4, wherein the layer of dielectric material comprises an oxide or a nitride.

6. The method of claim 5, wherein the selectively removing includes etching with an etchant derived from a fluorine bearing source gas.

7. The method of claim 4, wherein the selectively removing uses the grains of polysilicon as a mask for an etching process.

8. The method of claim 7, wherein the grains of polysilicon have an average size of between about 500–1000 Å.

9. The method of claim 7, wherein the layer of dielectric material comprises oxide and the selectively removing includes etching with an etchant derived from a fluorine bearing source gas.

10. The method of claim 7, wherein the second conductive layer comprises polysilicon deposited onto the grains of polysilicon, the columns of dielectric material and the first conductive layer.

11. The method of claim 10, wherein the third conductive layer comprises polysilicon.

12. The method of claim 11, wherein the layer of dielectric material comprises silicon oxide.

13. A method of providing increased capacitance to a charge storage structure in an integrated circuit device, comprising:
   providing a field effect transistor on a substrate;
   the field effect transistor having a source/drain region;
   providing a first dielectric layer over the field effect transistor and providing a contact via through the first dielectric layer to expose the source/drain region;
   providing a first polysilicon layer over the first dielectric layer and providing an electrical connection between the first polysilicon layer and the source/drain region;
   providing a second dielectric layer over the first polysilicon layer;
   providing a layer of hemispherical grained polysilicon over the second dielectric layer, the layer of hemispherical grained polysilicon exposing portions of the second dielectric layer between grains of the layer of hemispherical grained polysilicon;
   anisotropically etching through the second dielectric layer to expose portions of the first polysilicon layer in a pattern defined by the grains of the layer of hemispherical grained polysilicon, structures etched from the second dielectric layer extending above the first polysilicon layer;
   depositing a second polysilicon layer over the exposed pattern of the first polysilicon layer and over the structures etched from the second dielectric layer;
   providing a third dielectric layer over the second polysilicon layer; and
   providing a third polysilicon layer over the third dielectric layer, whereby a capacitive structure having two polysilicon layers separated by the third dielectric layer is formed over the etched second dielectric layer and in electrical contact with the portions of the first polysilicon layer exposed by the anisotropic etching.

14. The method of claim 13, wherein the anisotropically etching uses the grains of the layer of hemispherical grained polysilicon as a mask.

15. The method of claim 14, wherein the second polysilicon layer is deposited over the grains of the layer of hemispherical grained polysilicon.

16. The method of claim 15, wherein the second dielectric layer comprises silicon oxide.

17. The method of claim 16, wherein the grains have an average size of between about 500–1000 Å.

18. The method of claim 13, wherein the depositing of a second polysilicon layer includes depositing a conformal polysilicon layer over the exposed pattern of the first polysilicon layer and over the structures etched from the second dielectric layer.

19. A method of providing increased capacitance to a charge storage structure in an integrated circuit device, comprising:

providing an access circuit in and on a substrate, the access circuit controlling access to an electrode of the charge storage structure through an electrode contact;

providing a first conductive layer over the substrate and connected to the electrode contact;

providing a layer of dielectric material over the first conductive layer;

providing a layer of grains of polysilicon over a surface of the layer of dielectric material so as to leave uncovered portions of the surface of the layer of dielectric material between the grains of polysilicon;

selectively removing exposed portions of the layer of dielectric material, leaving spaced apart columns of the dielectric material extending above the first conductive layer beneath the grains, with portions of the first conductive layer exposed between the columns;

providing a second conductive layer over the columns and the exposed portions of the first conductive layer;

providing a capacitor dielectric layer over the second conductive layer; and providing a third conductive layer over the capacitor dielectric layer, whereby a capacitive structure having two conductive layers separated by the capacitor dielectric layer, is formed over the columns of the dielectric material and in electrical contact with the first conductive layer between the columns.

20. The method of claim 19, wherein the providing a second conductive layer includes providing a conformal conductive layer over the columns and the exposed portions of the first conductive layer.

* * * * *